United States Patent
Yeomans et al.

[11] Patent Number: 6,056,574
[45] Date of Patent: May 2, 2000

[54] RETENTION ASSEMBLY WITH CAP FOR PROCESSOR MODULES

[75] Inventors: Michael Anthony Yeomans, Camp Hill; Kevin Eugene Walker, Hershey, both of Pa.

[73] Assignee: The Whitaker Corporation, Wilmington, Del.

[21] Appl. No.: 09/162,945

[22] Filed: Sep. 29, 1998

[51] Int. Cl.[7] .................................................. H01R 13/62
[52] U.S. Cl. ......................... 439/327; 361/801; 361/802; 439/328
[58] Field of Search .................................... 439/327, 328, 439/157, 345, 346, 347, 325; 361/801, 802, 740, 759, 754, 756; 211/41.17; 220/241, 3.8, 326, 780, 786

[56] References Cited

U.S. PATENT DOCUMENTS

| | | | |
|---|---|---|---|
| 3,693,135 | 9/1972 | Vavrick et al. | 439/328 |
| 3,829,741 | 8/1974 | Athey | 317/101 DH |
| 4,178,051 | 12/1979 | Kocher et al. | 339/45 M |
| 4,349,237 | 9/1982 | Cobaugh et al. | 339/65 |
| 4,445,740 | 5/1984 | Wallace | 439/152 |
| 4,914,552 | 4/1990 | Kecmer | 361/415 |
| 5,162,979 | 11/1992 | Anzelone et al. | 361/415 |
| 5,283,713 | 2/1994 | Nagafuji et al. | 361/796 |
| 5,573,408 | 11/1996 | Laub et al. | 439/62 |
| 5,642,263 | 6/1997 | Lauruhn | 361/801 |
| 5,726,865 | 3/1998 | Webb et al. | 361/801 |
| 5,730,611 | 3/1998 | Cheng et al. | 439/160 |
| 5,762,513 | 6/1998 | Stine | 439/358 |
| 5,793,614 | 8/1998 | Tollbom | 361/732 |
| 5,829,601 | 11/1998 | Yurchenco et al. | 211/41.17 |
| 5,906,501 | 5/1999 | Longueville et al. | 439/327 |

*Primary Examiner*—Paula Bradley
*Assistant Examiner*—Ross Gushi
*Attorney, Agent, or Firm*—Anton P. Ness

[57] ABSTRACT

Retention assembly (10) includes an end section (30,104) at each end of a pair of board-mounted receptacle connectors and defines guide channels (20) for insertion thereinto of a pair of modules (22). A retention cap (14,100) is securable to posts (38,122) of end sections (30,104) and is movable transversely to be wedged against top surfaces (68) of modules (22).

16 Claims, 7 Drawing Sheets

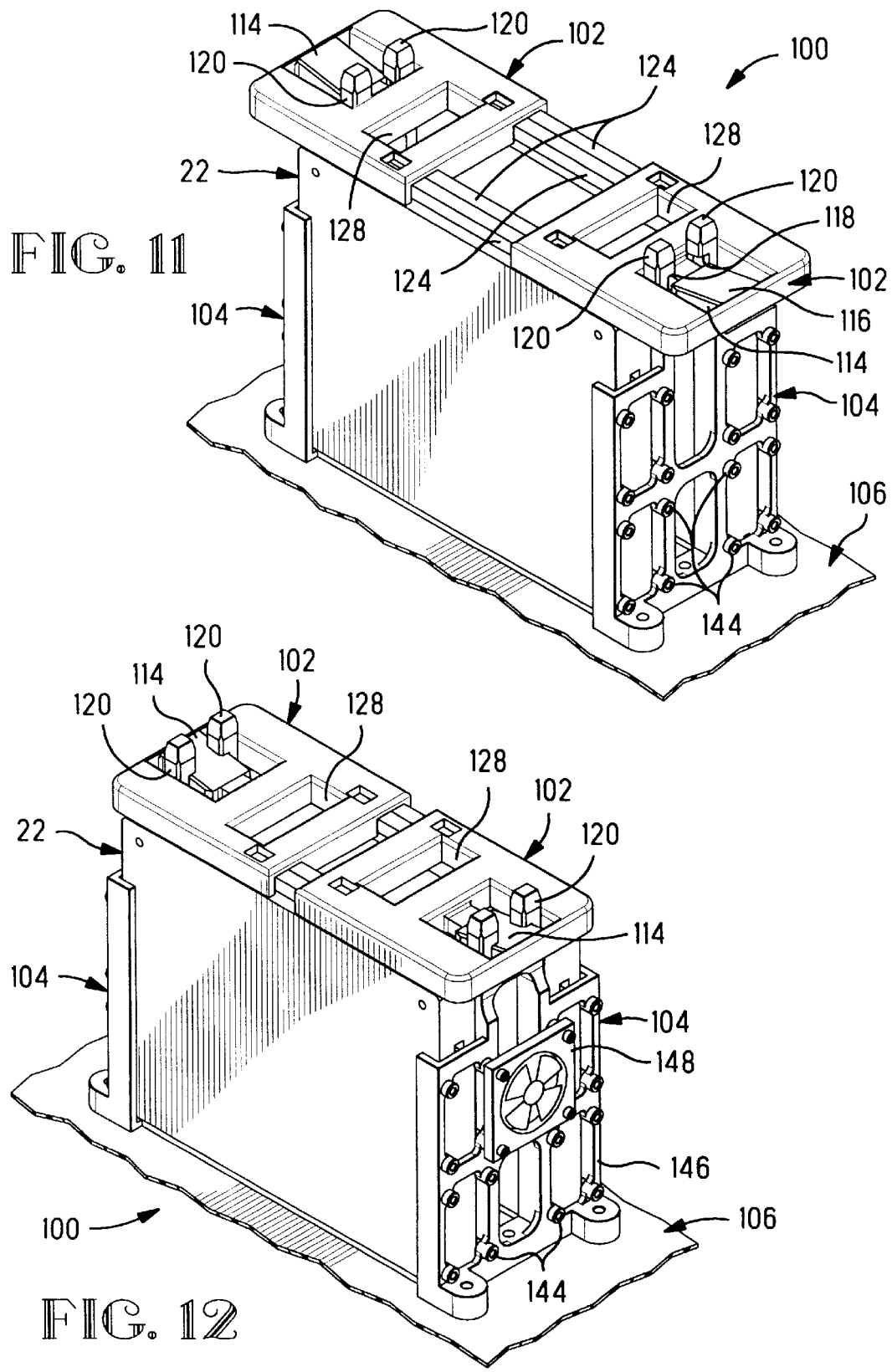

RETENTION ASSEMBLY WITH CAP FOR PROCESSOR MODULES

FIELD OF THE INVENTION

This relates to the field of electrical connectors and more particularly to components mountable to a circuit board.

BACKGROUND OF THE INVENTION

In computers and other electronic equipment, circuit boards are utilized to which are mounted numerous electrical and electronic components. Smaller circuit cards are utilized to establish electrical connections to a larger circuit board in a manner that permits removal and disconnection, by inserting an edge of the card into a receptacle connector mounted on the board and containing an array of contacts connected to circuits of the board; contact sections of the contacts are exposed within a card-receiving cavity of the connector that engage circuit pads on the card surfaces upon card insertion. It has become useful to secure certain cards within larger modules so that components mounted on the card are protected by the module covers during handling. Such modules need to be accurately guided during mating with the receptacle connector so that the leading end of the enclosed card is accurately received into the card-receiving cavity of the connector, since the module covers inhibit accurate visual alignment of the card with the cavity. It is known to provide elongate guide members projecting from the board from ends of receptacle connectors to facilitate mating in similar situations. Such elongate guide members may be mounted on the circuit board substantially prior to their actual use during module mating.

In U.S. patent application Ser. No. 09/066,251 filed Apr. 24, 1998 and assigned to the assignee hereof, is disclosed an assembly that includes a frame mountable on the circuit board surrounding the receptacle connector or optionally as an integral portion of the connector housing. At opposed ends of the frame are mounted respective guide members containing inwardly facing channels precisely aligned with the card-receiving cavity of the connector. Latches of the guide members will latch with cooperating latching sections of the modules when the modules have been fully inserted into the guide channels.

It is desired to provide a retention guide for use with a plurality of processor modules.

It is desired to provide assurance that the processor modules are retained within the retention guides in fully mated condition with respect to the receptacle connectors irrespective of the particular latching sections of the modules.

SUMMARY OF THE INVENTION

Guide or retention members of the assembly are defined by respective end sections at ends of one or more receptacle connectors, or to integral end sections of a frame surrounding the peripheries of the connectors. Each retention section includes at least one and preferably a pair of elongate vertical posts extending upwardly to upper ends, and a retention cap cooperates with the post upper ends to become secured in position atop the modules when the modules have been inserted fully into the guide channels of the end sections and thus mated to the receptacle connectors.

In one embodiment, the retention cap is an integral member that is translated transversely whereby the post upper ends cooperate with wedges of the retention cap to press the cap downwardly against the top surfaces of the modules.

In another embodiment, the retention cap is an assembly of two opposing halves that, by a pair of rails and railways, are movable toward each other until wedged downwardly against the module top surfaces.

An embodiment of the present invention will now be described by way of example with reference to the accompanying drawings.

BRIEF DESCRIPTION OF THE DRAWINGS

FIGS. 11 and 12 are isometric views of the assembly of FIG. 7 showing the retention cap halves initially unmated and fully mated, respectively.

DETAILED DESCRIPTION

Figure 1:
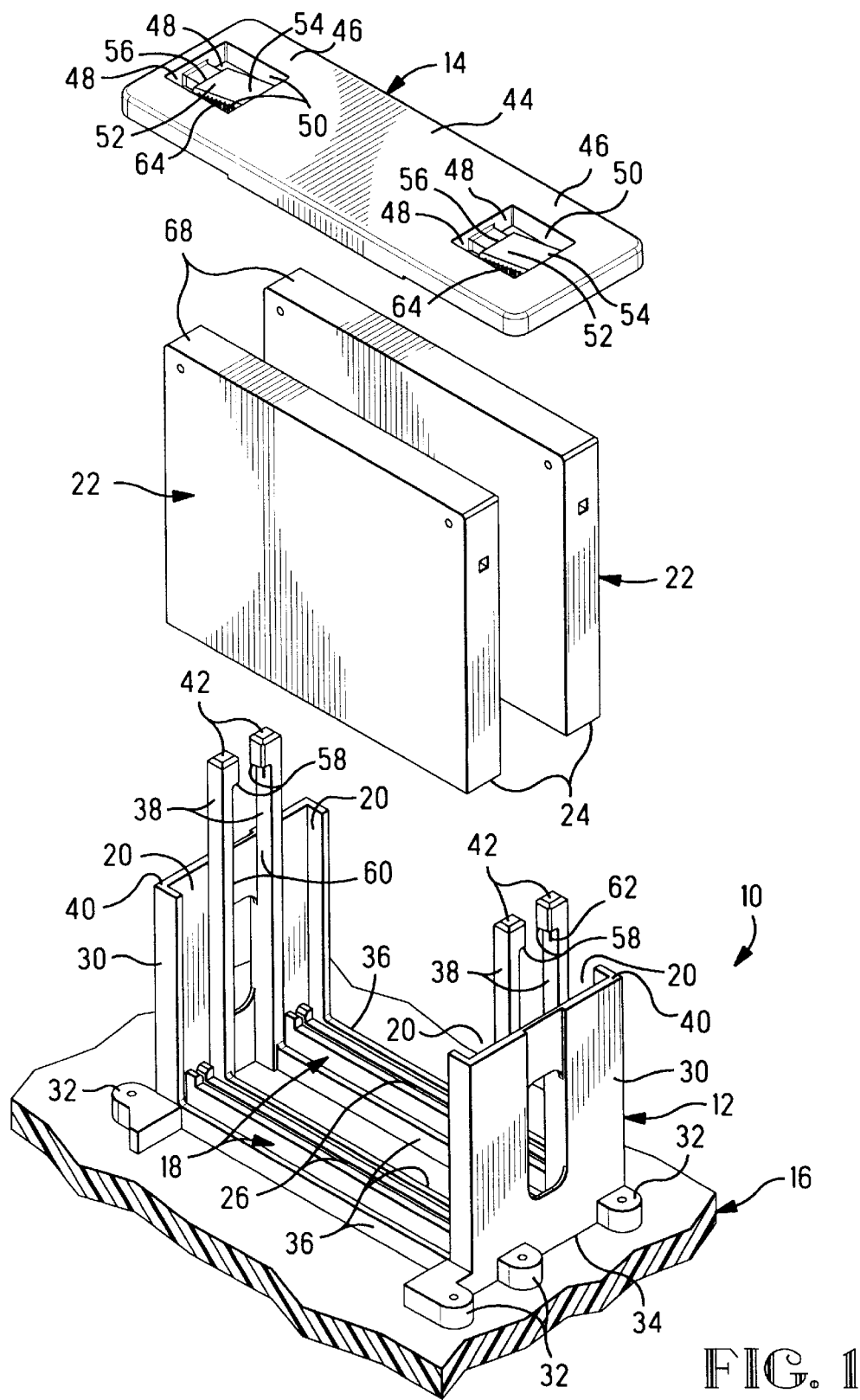
FIG. 1 is an isometric view of an assembly including pairs of retention members mounted to a frame, with a pair of processor modules poised for insertion into the assembly to become mated with respective receptacle connectors, and a first embodiment of retention cap positioned to be placed above the modules after insertion.
Figure 2:
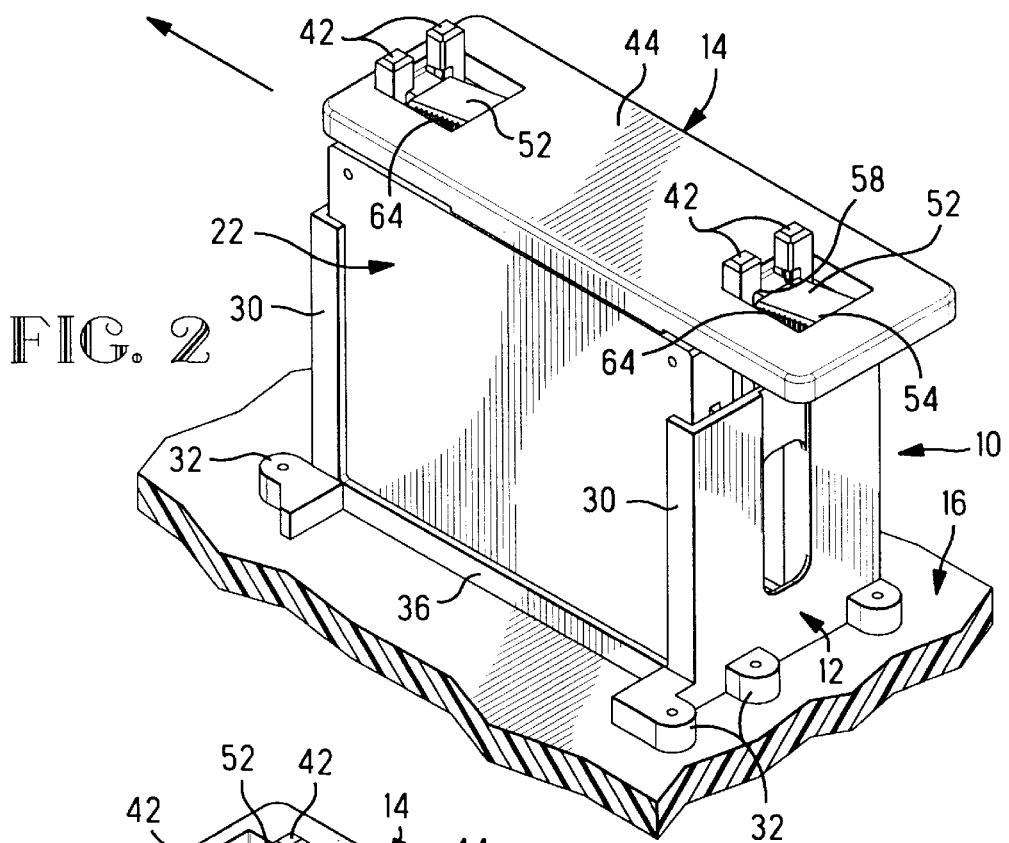
FIGS. 2 and 3 are isometric views with the modules fully inserted and the cap initially placed in an unlocked position onto the assembly atop the modules and then translated to a locked position.
Figure 3:
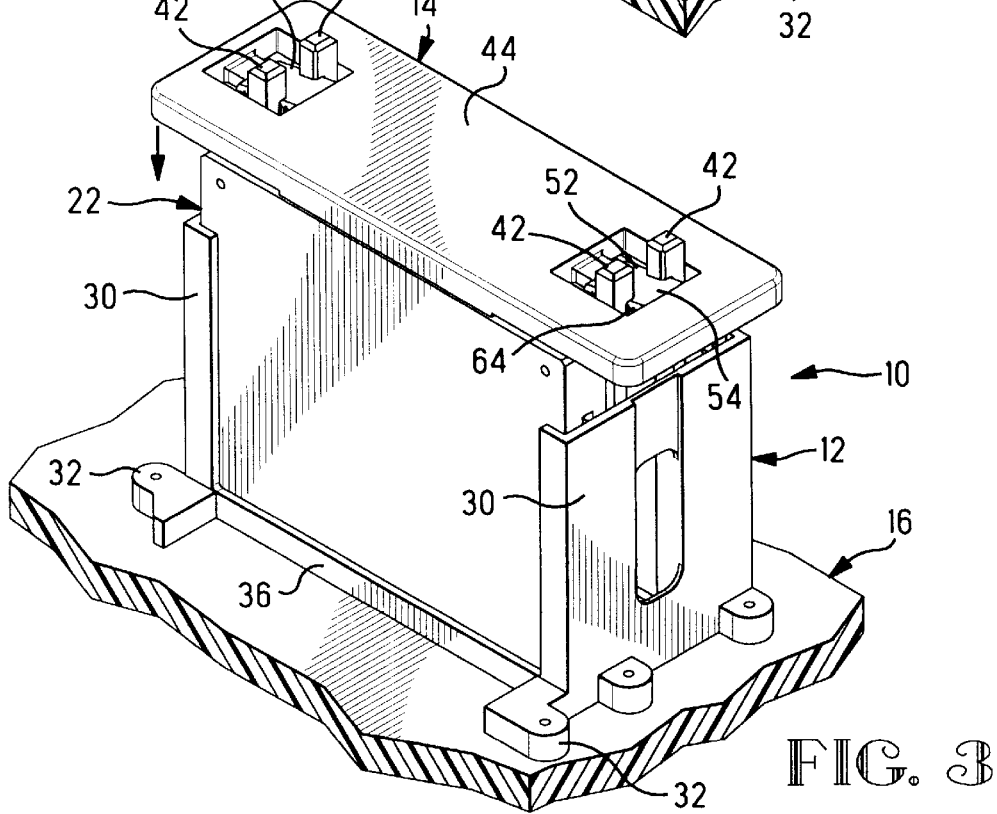
Figure 4:
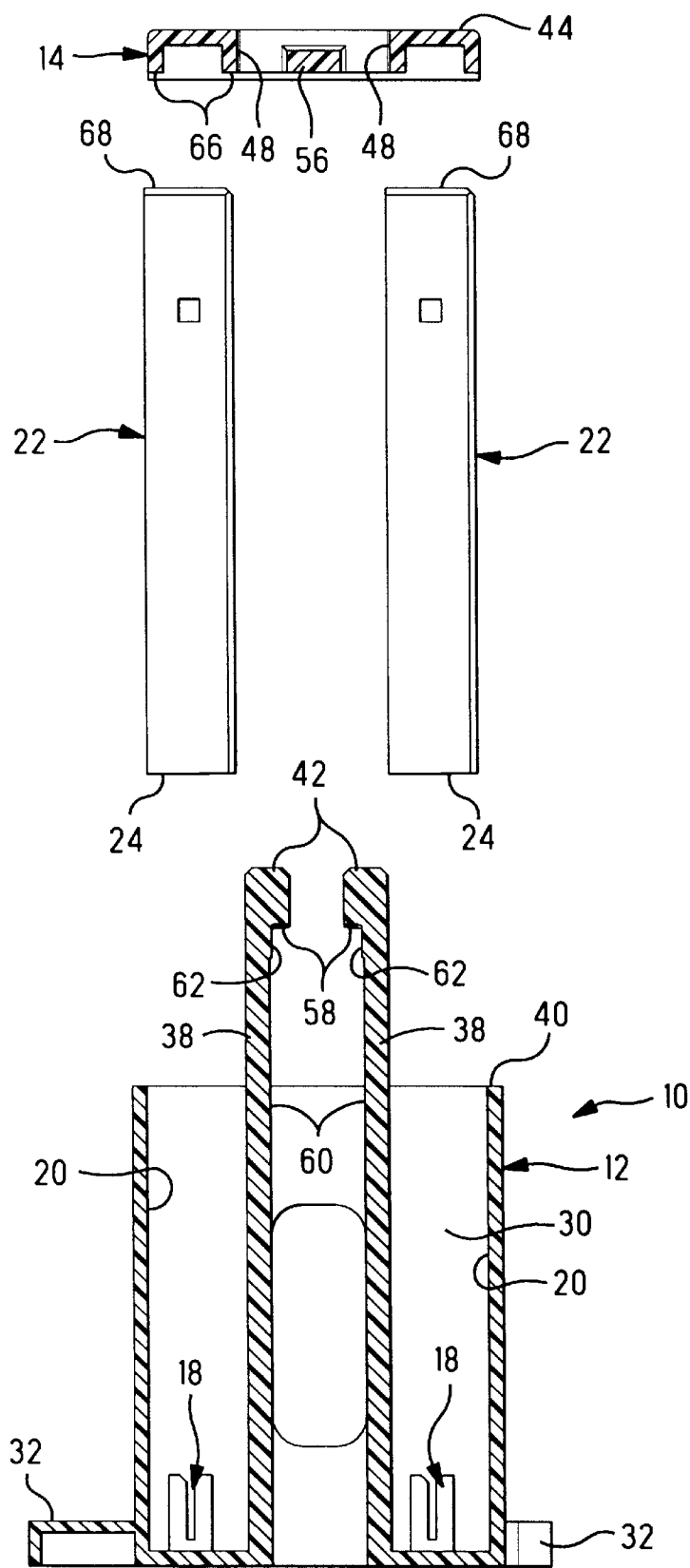
FIGS. 4 to 6 are cross-sectional views corresponding respectively to FIGS. 1 to 3 at one end of the assembly.
Figure 5:
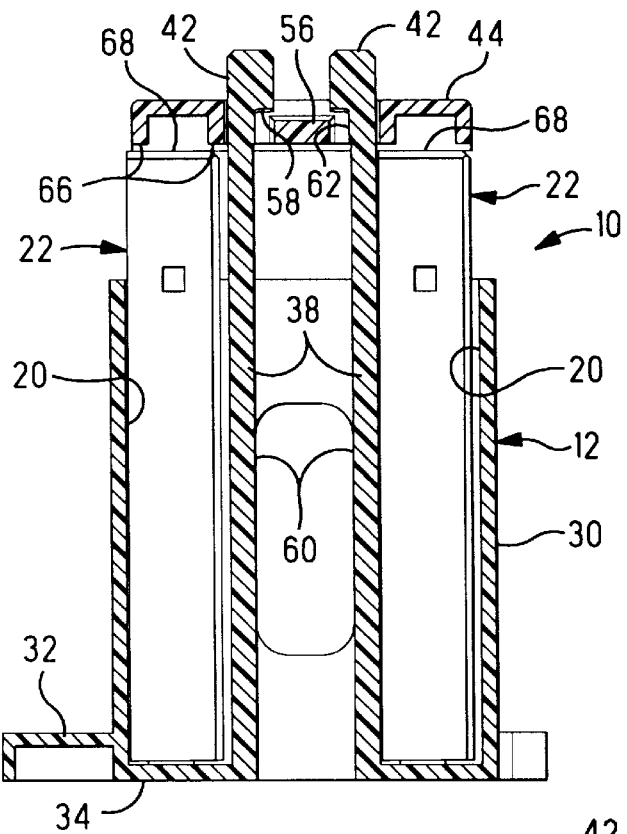
Figure 6:
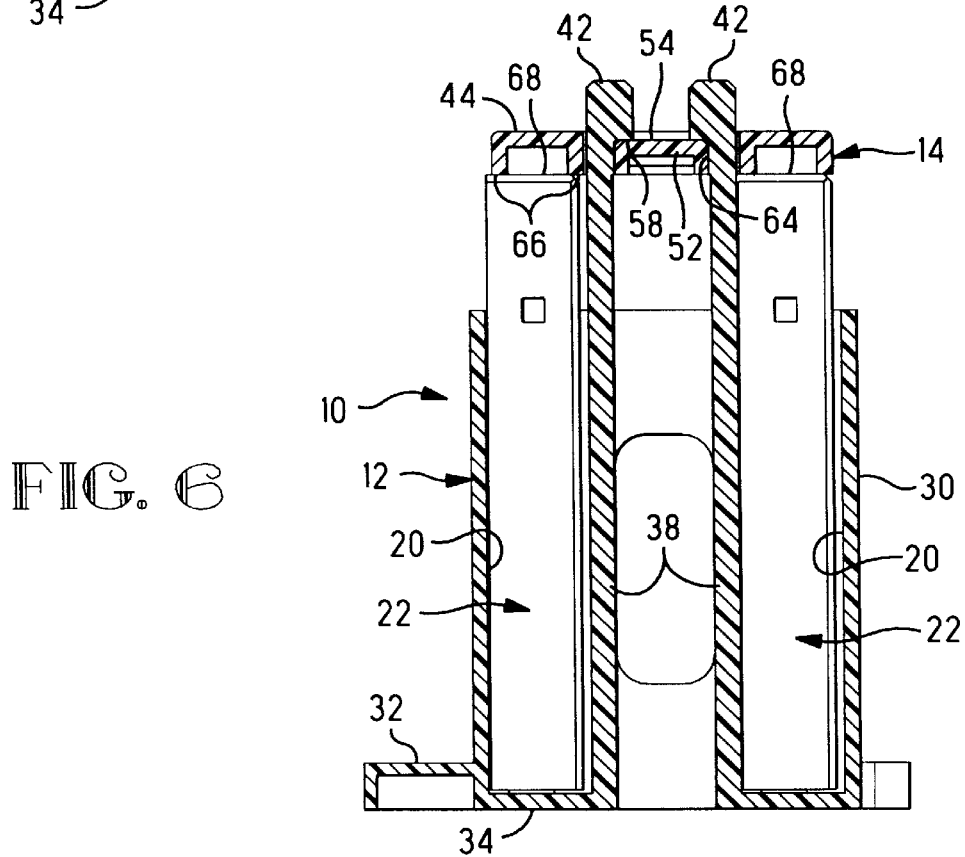
Figure 7:
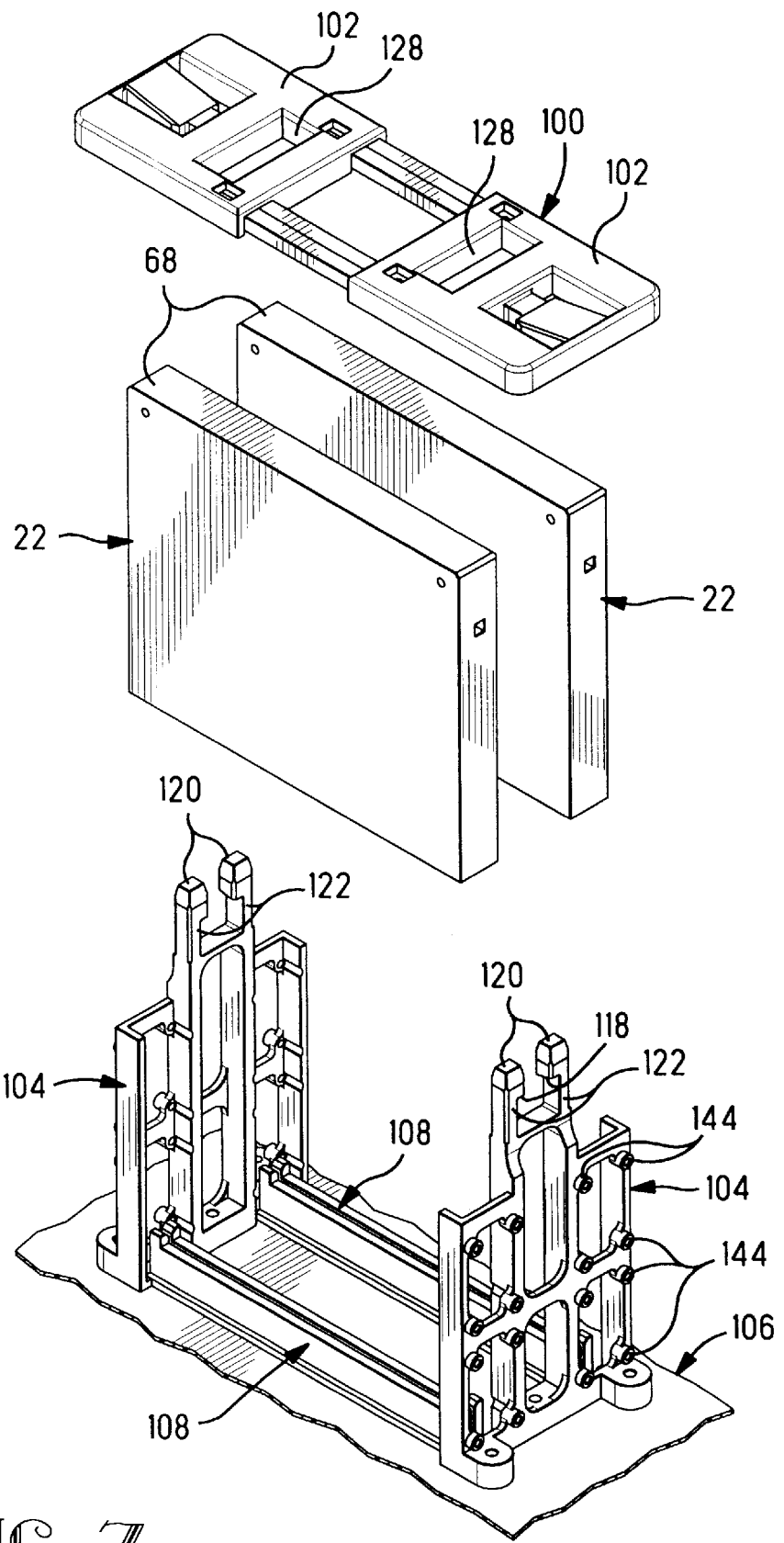
FIG. 7 is an exploded isometric view similar to FIG. 1 with a second embodiment of retention cap having two matable halves.
Figure 8:
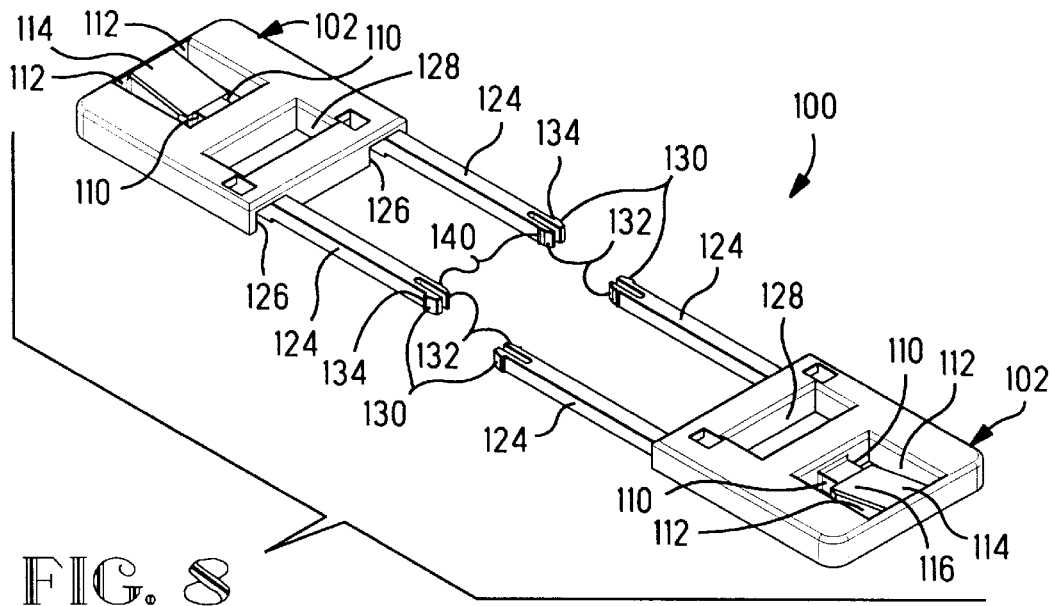
FIG. 8 is an isometric view of the retention cap of FIG. 7 showing the two mating halves positioned to be mated to each other.

Retention assembly 10 is shown to comprise a frame 12 and a retention cap 14. Frame 12 is mountable onto a circuit board 16 positioned accurately with respect to a pair of receptacle connectors 18. Pairs of opposed guide channels 20 extend upwardly from the receptacle connectors for guiding respective processor modules 22 into position to become mated with respective ones of the receptacle connectors. Edges of circuit cards within the modules are exposed at leading edges 24 thereof, to enter card-receiving slots 26 of the receptacle connectors for electrical connection of circuits of the cards with contacts of the connectors for interconnection with circuits of circuit board 16.

Frame 12 includes end sections 30, board-mounting sections 32 at board-mounting edges 34 thereof, the end sections being joined to several struts 36, and pairs of elongate posts 38 coextending upwardly beyond top edges 40 of end sections 30. Upper ends 42 of posts 38 cooperate with retention cap 14 to secure the cap to the assembly atop modules 22 after full insertion of modules 22 along guide channels 20 to mate with receptacle connectors 18.

Retention cap 14 includes a transverse cover body 44 with securing sections 46 at each end. Each securing section includes a pair of apertures 48 associated with elongate posts 38 of frame 12, adapted to receive therethrough upper ends 42 of the posts. Extending from apertures 48 are respective slots 50 also associated with posts 38, and a wedge 52 between slots 50. Both the slots 50 and wedge 52 at each end extend in a common direction with those of the other end of retention cap 14. Top surface 54 of each wedge 52 is angled gradually upwardly from a lower end 56 adjacent apertures 48.

Upper ends 42 of posts 38 act in cooperation with wedges 52 as retention cap 14 is translated horizontally after being positioned atop modules 22, with upper ends 42 of the posts extending upwardly through respective apertures 48. Each upper end defines a downwardly facing camming surface 58 that is similarly angled with respect to top surfaces 54 of wedges 52, with camming surfaces 58 of each pair of posts 38 defined along sides 60 of the posts that are facing each other at a respective end of frame 12. Preferably side edges 64 of wedges 52 are serrated, to cooperate with teeth 62 along inside side surfaces 60 of posts 38 immediately below camming surfaces 58 of upper ends 42, whereby retention cap remains in its farthest translated position with lower edges 66 of retention cap 14 pressing firmly against top surfaces 68 of modules 22.

FIGS. 7 to 12 illustrate a second embodiment of retention cap, an assembly 100 of two halves 102 that may be identical to each other. Retention cap assembly 100 is shown for use with opposed retention end sections 104 at mounted to board 106 at ends of receptacle connectors 108. Each cap half 102, shown best in FIGS. 8 to 10, includes apertures 110, slots 112 and wedges 114, similarly to retention cap 14 of FIGS. 1 to 6; upper surface 116 will cooperate with camming surfaces 118 of upper ends 120 of elongate posts 122 of retention halves 104. However, the slots and wedges are oriented in opposing directions with respect to the apertures, unlike those of the retention cap of FIGS. 1 to 6 wherein they are oriented in a common direction, since the retention cap halves 102 will be moved relatively toward each other when the retention cap assembly is being pressed against the module top surfaces.

Figure 9:
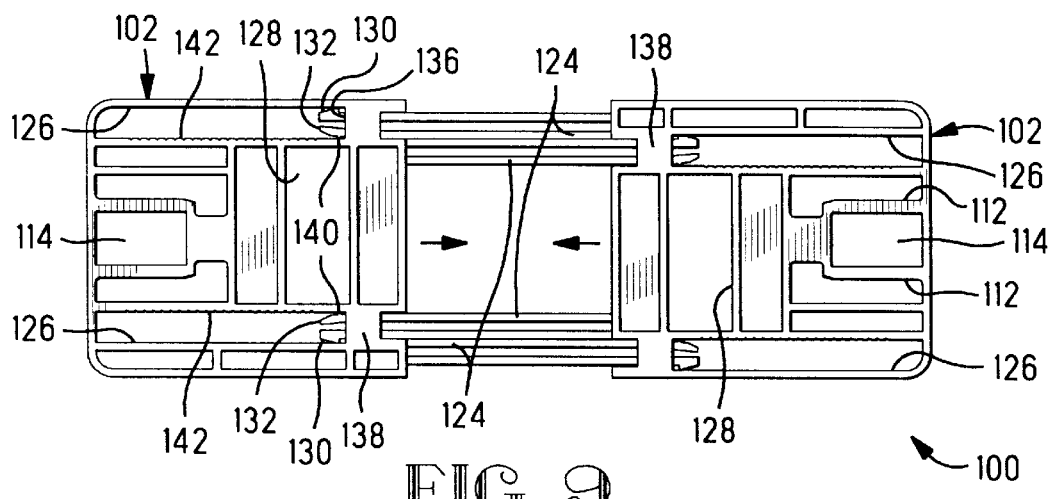
FIGS. 9 and 10 are bottom views of the retention cap halves of FIG. 8 in unmated and mated positions, respectively.
Figure 10:
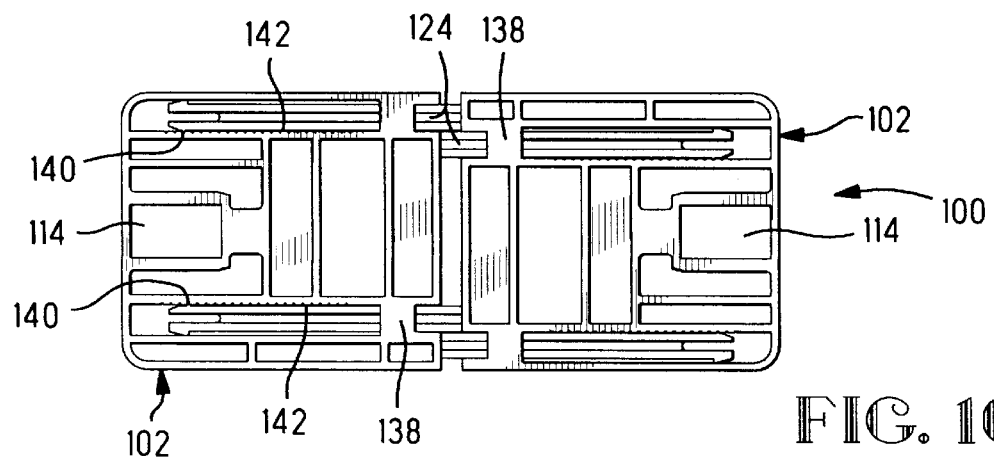

Each retention cap half 102 also is shown to include a pair of elongate fastening rails 124 coextending to the opposing retention half 102, cooperable with railways 126 of the opposing retention half not only to secure the two halves to each other, but also to permit relative axial movement between the two cap halves as indicated in FIGS. 9 and 10 and also in FIGS. 11 and 12. For convenience, large openings 128 are provided proximate the bases of fastening rails 124 enabling manual gripping for urging the two retention cap halves together.

At ends of each fastening rail 124 are opposed resilient fingers 130,132; finger 130 includes a latch projection 134 that cooperates with a corresponding stop surface 136 at the near end of railway 126 of the other retention half and also to ride atop a lower wall section 138 adjacent each railway entrance, all thereby securing the fastening rails in the railways and affixing the two opposing retention halves to each other for shipping, handling and ease of manipulation. Finger 132 includes a tooth 140 that cooperates with serrations along the inside surface of the other side 142 of railway 126, acting as a detent to secure the halves together in position when pushed furthest together, as shown in FIGS. 10 and 12, when wedges 114 have been pressed tightly against tip surfaces 68 of modules 22.

As shown in FIGS. 7 to 12, bosses 144 are provided along outwardly facing surfaces 146 of each retention end section 102, each boss containing an aperture therethrough providing for threading thereinto of fasteners (not shown). Bosses 144 thus permit mounting thereto of small fan components 148 (FIG. 12) to provide for forced air cooling of heat sinks (not shown) mounted on a side surface of each module 22. Bosses 144 along outward ends of the end sections enable mounting of fans to adjacent ones of the retention end sections in an array thereof, to cool heat sinks that extend between the adjacent end sections. One such small fan is a PCQuiet DC Fan sold by AAVID Inc. of Manchester, N.H.

The present invention could also be modified so that only one post is provided at each end section of the retention assembly, cooperable with a wedge of the retention cap, or a pair of wedges riding beneath camming ledges on opposed sides of the one post (not shown). Other variations and modifications can occur to the specific embodiment herein disclosed that are within the spirit of the invention and the scope of the claims.

What is claimed is:

1. A retention assembly for securing at least one module in fully mated relationship with a corresponding board-mounted receptacle connector, comprising:

opposing end sections mountable onto a circuit board at ends of the receptacle connector; and a retention cap securable to said opposing end sections atop said at least one module;

each one of said opposing end sections including at least one post projecting upwardly from the circuit board to an upper end;

said retention cap including a wedge cooperable with said upper end of said at least one post of each said end section when said retention cap is translated transversely with respect thereto, to urge said cap relatively toward said circuit board and against top surfaces of said at least one module.

2. The retention assembly of claim 1 wherein said retention cap includes a section cooperable with said at least one post of each said end section to maintain said cap in said translated position.

3. The retention assembly of claim 1 wherein said retention cap is an integral member.

4. The retention assembly of claim 1 wherein each said end section includes a pair of elongate posts extending upwardly beyond top surfaces of said modules, said end cap includes a pair of apertures through which said upper ends of said posts extend, and slots coextending from said apertures in a common direction at both ends of said retention cap to permit relative translation of said retention cap with respect to said post upper ends.

5. The retention assembly of claim 4 wherein said wedge is positioned between said slots at each said end of said retention cap.

6. The retention assembly of claim 1 wherein said upper end of said at least one post of each said end section includes a camming surface and each said wedge includes a cooperating surfaces engageable with said camming surface to urge said retention cap relatively toward said circuit board when said retention cap is translated transversely.

7. The retention assembly of claim 6 wherein said camming surfaces of said post upper ends face said circuit board, and said cooperating wedge surfaces face away from said circuit board and are angled with respect to said circuit board to move said retention cap with respect to said circuit board when said retention cap is translated transversely.

8. The retention assembly of claim 1 wherein said retention cap is an assembly of two opposing halves that are relatively movable toward and away from each other atop said module top surface.

9. The retention assembly of claim 8 wherein each said cap half includes a pair of rails coextending toward the other said cap half, and further includes a pair of railways cooperable with corresponding rails of said other cap half.

10. The retention assembly of claim 9 wherein each said rail includes a latch at a leading end thereof that latches behind a stop surface at a leading end of a said railway of said other cap half and also rides above a ledge along said railway, whereby said rails and railways affix said opposing retention cap halves to each other.

11. The retention assembly of claim 9 wherein each said rail includes a tooth section at a leading end thereof that cooperates with a plurality of serrations along a side wall of said railway to maintain the relative position of said retention cap halves with respect to each other.

12. The retention assembly of claim 9 wherein each said retention cap half includes a large opening facilitating manual gripping for urging said cap halves relatively toward each other.

13. The retention assembly of claim 9 wherein each said end section includes a pair of elongate posts extending upwardly beyond top surfaces of said modules, said end cap includes a pair of apertures through which said upper ends of said posts extend, and slots coextending from said apertures in a common direction at both ends of said retention cap to permit relative translation of said retention cap with respect to said post upper ends.

14. The retention assembly of claim 13 wherein said wedge is positioned between said slots at each said end of said retention cap.

15. The retention assembly of claim 13 wherein said upper end of each said post of each said end section includes a camming surface and each said wedge includes a cooperating surfaces engageable with said camming surface to urge said retention cap relatively toward said circuit board when said retention cap is translated transversely.

16. The retention assembly of claim 15 wherein said camming surfaces of said post upper ends face said circuit board, and said cooperating wedge surfaces face away from said circuit board and are angled with respect to said circuit board to move said retention cap with respect to said circuit board when said retention cap is translated transversely.

* * * * *